United States Patent [19]
Deveirman

[11] Patent Number: 5,625,317
[45] Date of Patent: Apr. 29, 1997

[54] TUNING METHOD FOR INTEGRATED CONTINUOUS-TIME FILTERS

[75] Inventor: Geert Deveirman, Tustin, Calif.

[73] Assignee: Texas Instruments Incorporated, Dallas, Tex.

[21] Appl. No.: 287,173

[22] Filed: Aug. 8, 1994

[51] Int. Cl.[6] .................... H03K 5/00; H04B 1/00
[52] U.S. Cl. .................... 327/353; 327/552; 327/560; 330/109; 330/304; 330/305; 330/254
[58] Field of Search .................... 333/17.1, 174; 330/252, 304, 305, 303, 107, 109, 254; 327/552, 553, 551, 560, 561, 563, 103, 100, 558

[56] References Cited

U.S. PATENT DOCUMENTS

| | | | |
|---|---|---|---|
| 4,340,868 | 7/1982 | Pace | 330/107 |
| 5,023,491 | 6/1991 | Koyama | 327/553 |
| 5,063,309 | 11/1991 | Yamasaki | 327/553 |
| 5,200,716 | 4/1993 | Amano | 327/553 |
| 5,243,239 | 9/1993 | Khan et al. | 327/553 |
| 5,289,136 | 2/1994 | De Veirman et al. | 330/252 |
| 5,371,425 | 12/1994 | Brown | 330/254 |
| 5,440,264 | 8/1995 | Sevenhans et al. | 322/552 |

Primary Examiner—Timothy P. Callahan
Assistant Examiner—Dinh T. Le
Attorney, Agent, or Firm—W. Daniel Swayze, Jr.; W. James Brady, III; Richard L. Donaldson

[57] ABSTRACT

A high-frequency integrated continuous-time filter with built-in test mode. The present invention provides the ability to easily track the cutoff frequency of the filter without the additional power and area requirements and noise sources present in prior art master/slave tuning schemes. Furthermore, the filter being tested is the actual filter that is used to process signals, unlike the prior art where a similar but separate filter or oscillator is used to tune the bias values for both circuits. Better tuning accuracy is thus obtained in the present invention. The circuit is designed to oscillate in test mode at the cutoff frequency of the filter. Oscillation is achieved by moving the poles of the filter from the left half-plane either onto the imaginary axis or into the right half-plane. The filter frequency accuracy is established by trimming the frequency of the oscillation in test mode during wafer probe or by adjusting the circuit biasing to tune the cutoff frequency in test mode during power-up or between reads in a memory system. The oscillation is disabled during normal operation of the filter.

49 Claims, 5 Drawing Sheets

TUNING METHOD FOR INTEGRATED CONTINUOUS-TIME FILTERS

BACKGROUND OF THE INVENTION

1. Field of the Invention

This invention relates to the field of analog circuits, and, in particular, to continuous-time filters.

2. Background Art

Integrated circuit continuous-time filters have gained significant importance and industrial acceptance, particularly for applications in the megahertz frequency range. The major drawback of this type of filter is that the pole frequency is inversely proportional to an RC (or $g_m/C$) time constant, which is subject to large uncontrollable absolute component variations. Consequently, a post fabrication adjustment of the pole frequency to the nominal design value by means of trimming or tuning is generally required.

A high frequency continuous-time integrated circuit filter is comprised of a number of filter sections. These filter sections are, in effect, "RC" circuits in which the resistance (R) and the capacitance (C) of the filter element affect the timing accuracy of the filter itself. In the prior art, these filters have been constructed of discrete elements where each element has an accuracy within a desired range. When implementing a filter in an integrated circuit, however, variations in resistance and capacitance can occur. Thus, the accuracy of an integrated circuit filter varies with the R and C of the integrated circuit, or when transconductance is used, the gm and C. It is desired to compensate for these variations to provide an accurate, predictable, stable filter.

Two distinctly different approaches can be identified in adjusting the pole frequency of a monolithic continuous-time filter: a one-time trim during wafer probe (or final test) and an on-chip tuning loop which adjusts the cutoff (−3 dB) frequency, $f_c$, either continuously or periodically upon user command.

In the trim method, the pole frequency is adjusted only once, usually at wafer probe, and careful circuit design is required to guarantee minimal variations from the target cutoff frequency, $f_c$, over temperature and supply voltage as well as over the cutoff frequency range in the case of a programmable filter. The advantages of this method are its simplicity and the absence of interference from a reference and on-chip tuning circuitry. The disadvantage is that it requires being able to measure $f_c$. Accurately measuring a filter's pole frequency in the megahertz range on a production tester (ATE) is extremely difficult. Unshielded wires of up to a few inches in length between the part and the tester result in significant noise coupling, feedthrough and additional attenuation.

In U.S. Pat. No. 5,063,309, Yamasaki proposes the addition of a separate oscillator circuit to the continuous-time filter IC. The oscillation frequency ($f_{osc}$) of the oscillator is designed to track the filter's cutoff frequency, $f_c$. Both filter and oscillator are connected to a common adjustable bias circuit. FIG. 1 shows a diagram of a circuit illustrating the principle of Yamasaki.

In FIG. 1, a bandgap reference 100 provides a stable voltage to the base of transistor Q104. The emitter of transistor Q104 is coupled to a grounded external resistor Rx. The bandgap reference voltage, the base-emitter voltage of transistor Q104, and the resistance of external resistor Rx determine the collector current of transistor Q104 that is provided to the programmable current source 101, here shown as a digital-to-analog converter (DAC). Based upon digital inputs, DAC 101 outputs a current equivalent to the collector current of transistor Q104 multiplied by a programmable constant. DAC 101 provides the output current to the collector of transistor Q105.

The collector and base of transistor Q105 are coupled together. The emitter of transistor Q105 is coupled through trimmable resistor R1 to ground. The base of Q105 is also coupled to the bases of transistors Q106 and Q107. The emitters of transistors Q106 and Q107 are coupled to grounded resistors R2 and R3, respectively. Transistors Q106 and Q107 act as current mirrors in conjunction with transistor Q105. The collector current in transistor Q106 is approximately R1/R2 times the collector current of transistor Q105. The collector currents of transistors Q106 and Q107 are provided as bias currents to filter block 102 and oscillator block 103, respectively. The circuit could also be done without the bandgap reference at the loss of some temperature stability. Also, the circuit could be constructed with MOS instead of bipolar devices.

Trimming resistor R1 increases or decreases the bias currents supplied to the filter and oscillator by equivalent amounts. These changes in the bias currents are reflected in equivalent changes in the cutoff frequency of filter 102 and the oscillation frequency of oscillator 103. Since measuring $f_{osc}$ involves taking a single frequency reading rather than a magnitude measurement, it can be easily accomplished using ATE. Based on the $f_{osc}$ measurement, $f_{osc}$ and simultaneously $f_c$ are adjusted to their desired valued, i.e. the common bias circuit is adjusted. The adjustment is made by zener zap, fuse blowing, or laser trimming in the case of a thin film resistor of resistor R1. R1 could also be a diffused or poly resistor. After the initial trim, the oscillator is disabled. With trimming accomplished at wafer probe, the oscillator would typically not be wire-bonded out to pins in the final package. Therefore, the actual trim procedure is completely transparent to the end user. There is no power nor potential feedthrough penalty. The disadvantage of this method is wasted silicon area for the oscillator which is used only once for a very short time period. Also, less confidence is gained than would be the case if the filter itself were tuned rather than the oscillator since one relies on matching.

In other prior art filters, a filter's accuracy is established by trimming an external resistor. Such a filter is described in "Single-Chip Y/C Signal-Processing LSI for 8 mm VCR System," Yamaguchi et al., IEEE BCTM, 1987.

The on-chip tuning method which is most commonly reported and which is being used in some commercially available IC's is the master-slave approach. FIG. 2 illustrates an on-chip tuning approach. A reference clock 208 provides reference signal 203 to $f_c$ control circuit 202, as well as master block 200 if the master circuit is a filter. The master filter/oscillator output 204 is provided to control circuit 202 for comparison with reference signal 203. Control circuit 202 supplies bias signal 205 to master filter/oscillator 200 and slave filter 201. Slave filter 201 receives input 206 and provides filtered output 207 continuously.

In further detail, an oscillator or filter (the "master" 200) which closely matches the actual signal processing filter (the "slave" 201) is placed inside a control loop (e.g. PLL) and its $f_{osc}$ or $f_c$ is locked to an accurate external reference frequency 208. An error correction signal is generated that is also provided to the slave or used to adjust a common bias circuit. When the master loop is in lock, the $f_c$ of the slave filter is corrected to its desired value. The master-slave approach avoids the need for an initial $f_c$ measurement. Also, since tuning is continuous, it can also account for drift due to temperature, supply voltage and aging. However, there is a significant area and power overhead for the master filter/oscillator and control circuitry, and a stable external reference must be available. There is also the potential for significant feedthrough from the master control loop to the slave, resulting in increased noise and distortion.

Such prior art filters are described in "Gyrator Video Filter IC with Automatic Tuning," Moulding, K. W. et al., IEEE JSCC, Vol. SC-15 No. 6, December 1980, and "Design and Performance of a Fully Integrated Bipolar 10.7 MHz Analog Bandpass Filter," Chii-Fa Chiou, and Rolf Schaumann, IEEE JSCC, Vol. SC-21, February 1986. Other references including this approach are *Design of Analog Filters: Passive, Active RC, and Switched-Capacitor*, by R. Schaumann, M. S. Ghausi, and K. R. Laker, published by Prentice Hall in New Jersey, 1990; and "Continuous-Time MOSFET-C Filters in VLSI," Y. Tsividis, M. Banu, and J. Khoury, also in IEEE JSSC, Vol. SC-21, February 1986.

A major drawback for both methods described above is that in neither case is the filter itself measured and/or adjusted directly. Rather, one relies upon matching between an additional filter or oscillator and the actual filter of interest. A variation of the master-slave approach, described by Tsividis in "Self-Tuned Filters," in Electronic Letters, volume 17, no. 12, pp. 406–407, published in June 1981, envisions a complete duplication of the slave filter. While one of the filters is being tuned in the loop, the other one is processing signals and its control voltages and/or currents are being held constant. Periodically the filters are interchanged. By tuning the actual filter itself in this way, one would expect better performance (i.e. $f_c$ accuracy). However, this approach requires a complete duplication in hardware of the filter circuit and further circuitry for switching between the filters and storing the bias values. The circuit takes up more die area, uses more power and must be carefully designed to reduce the effects of transients introduced by the switching circuit.

SUMMARY OF THE INVENTION

The present invention is a high-frequency integrated continuous-time filter with built-in test mode. The present invention provides the ability to easily track the cutoff frequency of the filter without the additional power and area requirements and noise sources present in prior art master/slave tuning schemes. Furthermore, the filter being tested is the actual filter that is used to process signals, unlike the prior art where a similar but separate filter or oscillator is used to tune the bias values for both circuits. Better tuning accuracy is thus obtained in the present invention. The circuit is designed to oscillate in test mode at the cutoff frequency of the filter or one of its sub-blocks. Oscillation is achieved by moving the poles of the filter from the left half-plane into the right half-plane or onto the imaginary axis. The filter frequency accuracy is established by trimming the frequency of the oscillation in test mode during wafer probe or by adjusting the circuit biasing to tune the oscillation frequency in test mode during power-up or between reads in a memory system. The oscillation is disabled during normal operation of the filter.

In the preferred embodiment of the invention, the continuous-time filter is made up of several biquad sections, which are in turn comprised of integrators made up of capacitors and transconductance amplifiers in feedback. The poles of the biquad sections are determined by the gm/C time constants of the integrator sections. By switching in an additional transconductance stage with positive feedback, a negative transconductance term is used to cancel out the first order term in the denominator of the second order biquad transfer function. The resulting system is an oscillator that oscillates at the cutoff frequency of the biquad in operational mode.

While in test mode, the circuit is manually or automatically tuned to adjust the cutoff frequency to the desired value. In the preferred embodiment, tuning is accomplished by altering the tail current of an emitter-coupled pair in each transconductance amplifier.

The additional transconductance amplifier used to create the negative transconductance in the preferred embodiment is a non-linearized emitter-coupled pair requiring the addition of only three transistors and a single resistor. The present invention is thus able to provide superior tunability without the large power and area costs of the prior art.

DETAILED DESCRIPTION OF THE INVENTION

Figure 2:
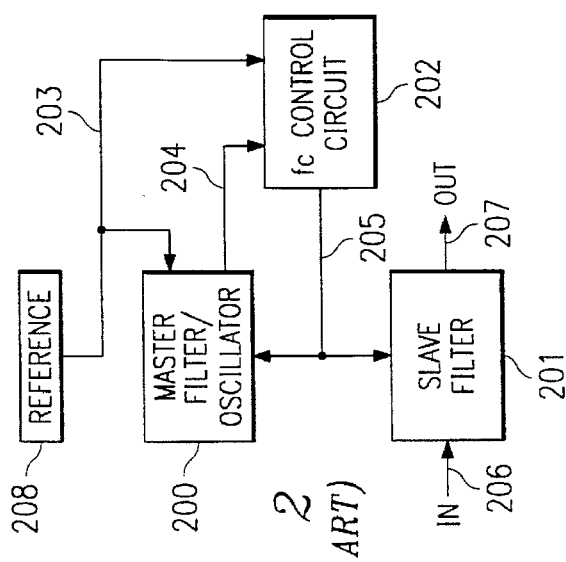
FIG. 2 is a circuit diagram of a master/slave tuning scheme of the prior art.
Figure 1:
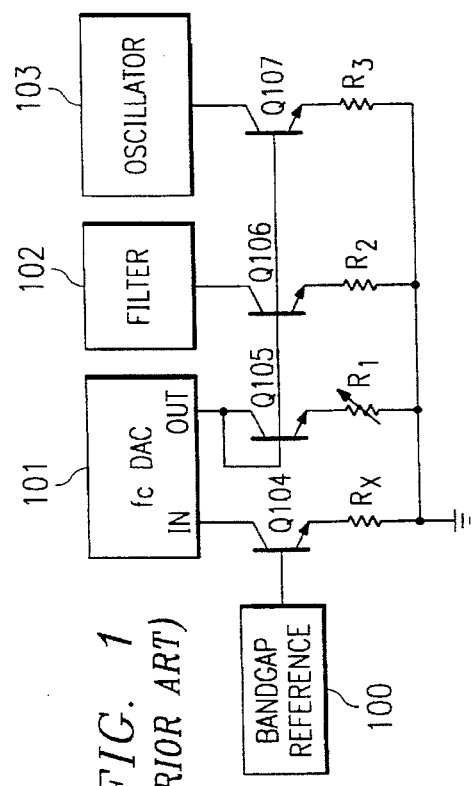
FIG. 1 is a circuit block diagram of a one-time tuning scheme of the prior art.

The present invention is an integrated circuit high frequency continuous-time filter tuning method. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

In integrated continuous-time filters, process variations cause variations in circuit elements such as capacitors. These variations cause the poles of continuous-time filters to deviate from their desired locations resulting in undesired frequency response characteristics, e.g. misplacement of the cutoff frequency. Filter tuning methods of the prior art are either limited to low frequency applications due to the need to read the frequency response of the circuit directly or require large area and power overhead for duplicate filters or oscillators. The duplication schemes have the added disadvantage that they never tune the filter directly, but rely on matching of components between master and slave portions of the integrated circuit. The present invention provides high frequency performance with a minimum of power and area usage beyond that required for the filter circuit itself. Further, the present invention tunes the filter circuit directly, achieving more accurate results.

The present invention implements a test mode in which the filter becomes an oscillator that oscillates at the cutoff frequency of the filter or of one of its sub-blocks. During test mode (or oscillation mode), the oscillation frequency is detected directly and through one of several known methods, such as trimming a resistor, programming bias currents from a programmable current source or programming control voltages from a programmable voltage source, the circuit is tuned to the desired frequency. After the desired frequency is reached, the circuit is released from test mode and the filter operates at the tuned cutoff frequency. The circuit can either be tuned in a one-time trimming process or it may be tuned at power-up. Further, with proper circuit design techniques, $f_c$ drift over temperature and supply can be minimized and is usually a relatively slow function of time. On-chip tuning therefore does not have to be continuous, but can be applied periodically or even just once upon power-up.

In many applications, such as for instance the disk drive read channel, there exist occasional "dead" times between signals that need to be processed by the filter. During these time intervals, the filter itself is tuned, (e.g. with an on chip turning loop) making the addition of a master oscillator or filter of the prior art unnecessary. Depending on the specifics of the tuning approach, the ability to turn the filter or portions of it into an oscillator is desirable. In the case of a higher order filter consisting of cascaded lower order building blocks (e.g. biquads), all such building blocks can periodically be converted into an oscillator. Optimum $f_c$ accuracy can be achieved by tuning each oscillating sub-section individually.

The test mode is implemented by altering the pole characteristics of the filter. When test mode is initiated, circuitry is introduced or feedback connections are reversed in polarity in order to move poles lying in the left half of the s-plane onto the imaginary axis or even into the right half-plane. The resulting transfer function of the circuit is that of an oscillator. In the preferred embodiment, a transconductance-based filter formed of biquad sections is described. However, the invention is in no ways limited to such an embodiment and in fact has applications in many types of filters. It is directly applicable to biquads, higher-order state-variable filters or LC ladder implementations in bipolar, CMOS, BiCMOS and GaAs. The transconductance could be either voltage or current controlled as well.

Figure 5:
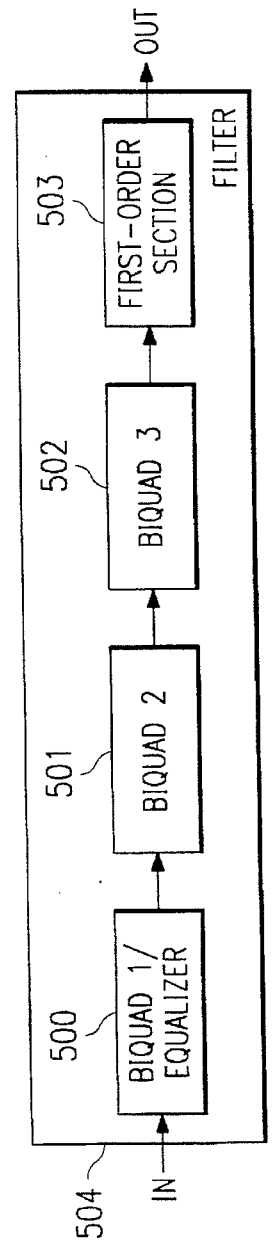
FIG. 5 is a block diagram of a high order filter comprised of several biquads and a first-order section.

In the preferred embodiment, a high-order filter is formed from a series of biquad gm-C sections. FIG. 5 shows a block diagram of a high-order filter comprised of several second-order filter sections and a single first-order filter section. Block 504 represents a seventh-order filter comprising biquad sections 500–502 and first-order section 503. The filter sections are coupled in series with biquad1/equalizer 500 at the front end, followed by biquad2 501, then biquad3 502, and finally first-order section 503. Higher order filters can be implemented with more sections and lower order filters can be implemented with fewer sections or even a single biquad for a second-order case.

Figure 7:
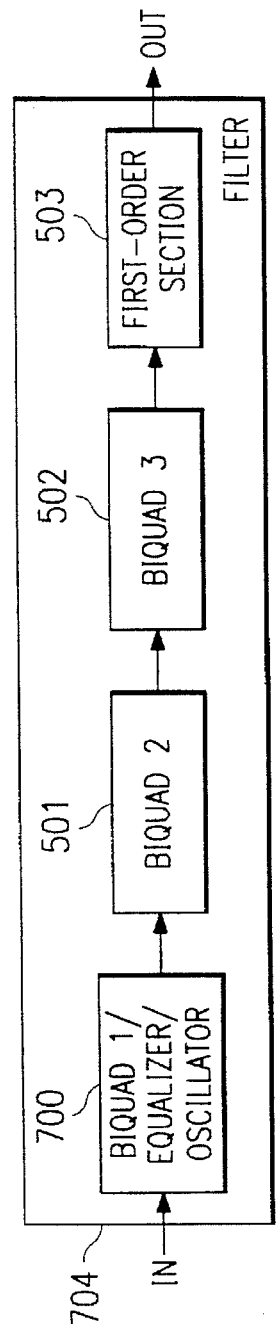
FIG. 7 is a block diagram of a the preferred embodiment of a high order filter implementing the present invention.

Biquad1/equalizer 500 receives the input signal and performs magnitude equalization for pulse slimming purposes. The subsequent sections perform further filtering on the signal with block 503 providing the final filtered output. In the present invention, at least one of the filter sections is equipped with test mode capability. FIG. 7 shows the same filter as FIG. 5 with the addition of test mode capability in the first biquad section. Filter 704 is equipped with filter sections 501–503 as described with respect to FIG. 5. Input filter section 500 is replaced with biquad1/equalizer/ oscillator 700. During standard operation, block 700 operates as a standard biquad/equalizer section. However, when test mode is enabled, block 700 becomes an oscillator and the output frequency is read directly from the filter output. The filter is then tuned until the output frequency conforms to the desired value. The single oscillator section may be used to tune the entire filter or each filter block may be equipped individually with test mode capability.

Figure 10:
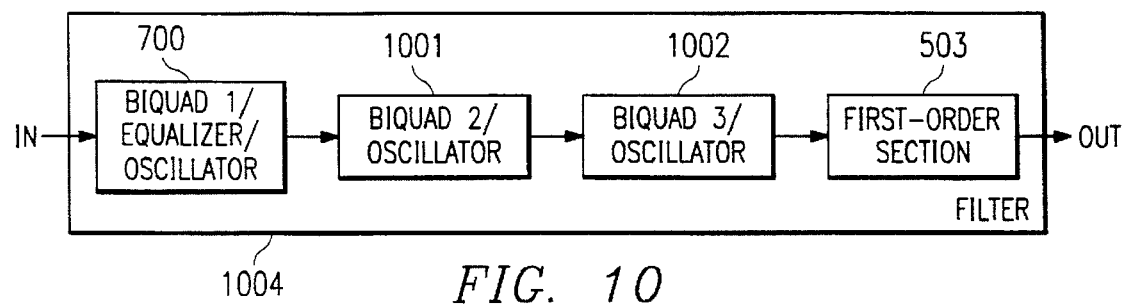
FIG. 10 is a block diagram of an alternate embodiment of a high order filter implementing the present invention.

FIG. 10 is a block diagram of a high order filter in which each biquad is equipped with test mode capability. In filter 1004, biquads 1001 and 1002 take the place of biquads 501 and 502 from FIG. 7. This individual tuning method provides for higher tuning accuracy at the cost of only a few transistors per filter block.

Test mode oscillation of monolithic gm-C filters is accomplished by reversing the polarity of one or more of the feedback connections, or by switching in an extra transconductance of appropriate positive or negative value to move poles from the left half of the s-plane onto the imaginary axis or even into the right half-plane in some embodiments. An oscillation mode added to one of the biquads requires only three additional transistors and one resistor. In the oscillation mode, the biquad oscillates at its pole frequency which is directly proportional to the overall filter's cutoff frequency $f_c$. The oscillation frequency can be measured at the regular filter output terminals. The advantages over the prior art are clear: negligible circuit overhead and easy frequency measurement on ATE. In addition, there is the potential for better trim accuracy since the filter itself is used rather than relying on matching with a separate oscillator block.

Figure 3:
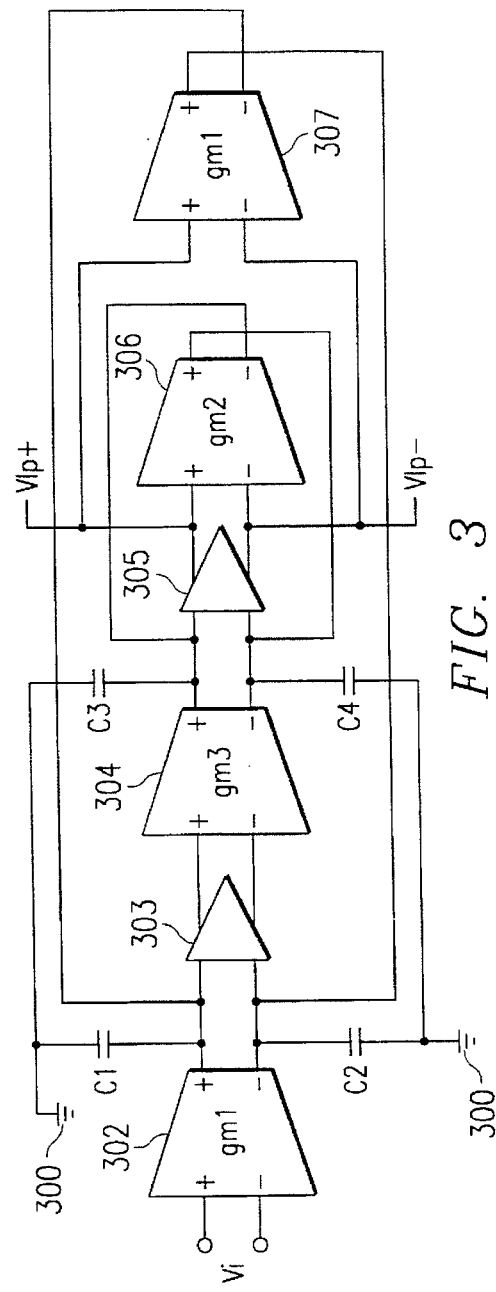
FIG. 3 is a circuit block diagram of a single biquad filter.

FIG. 3 is a circuit block diagram of one possible biquad structure. Differential input Vi is provided to the input ports of transconductance amplifier 302. The positive output port of transconductance amplifier 302 is coupled to capacitor C1, the positive input port of buffer 303, and the negative output port of transconductance amplifier 307. The negative output port of transconductance amplifier 302 is coupled to capacitor C2, the negative input port of buffer 303, and the positive output port of transconductance amplifier 307. The positive and negative output ports of buffer 303 are coupled to the positive and negative input ports, respectively, of transconductance amplifier 304. The positive output port of transconductance amplifier 304 is coupled to capacitor C3, the positive input port of buffer 305, and the negative output port of transconductance amplifier 306. The negative output port of transconductance amplifier 304 is coupled to capacitor C4, the negative input port of buffer 305, and the positive output port of transconductance amplifier 306. Capacitors C1–C4 are coupled to stable reference node 300 (ground). The positive output port of buffer 305 is coupled the positive input ports of transconductance amplifiers 306 and 307. The negative output port of buffer 305 is coupled to the negative input ports of transconductance amplifiers 306 and 307. The positive and negative output ports of buffer 305 represent the lowpass output ports (Vlp+ and Vlp−) of the biquad.

In the circuit of FIG. 3, buffers 303 and 305 represent unity-gain buffers used for level shifting and biasing purposes. Capacitors C1–C4 all have a capacitance value of C in this example. Transconductance amplifiers 302, 304, 306 and 307 are voltage-in current-out amplifiers with gains of gm1, gm3, gm2 and gm1, respectively. The capacitors can be visualized as current-in voltage-out devices with impedances of 1/sC.

The circuit of FIG. 3 implements the biquadratic lowpass transfer function:

$$\frac{Vlp}{Vi} = \frac{gm1gm3}{[s^2C^2 + sCgm2 + gm1gm3]} \quad [1]$$

with $$\omega_0 = \frac{\sqrt{gm1gm3}}{C} \quad [2]$$

where $\omega_0 = 2\pi f_c$, and $$Q_0 = \frac{\sqrt{gm1gm3}}{gm2} \quad [3]$$

Figure 4:
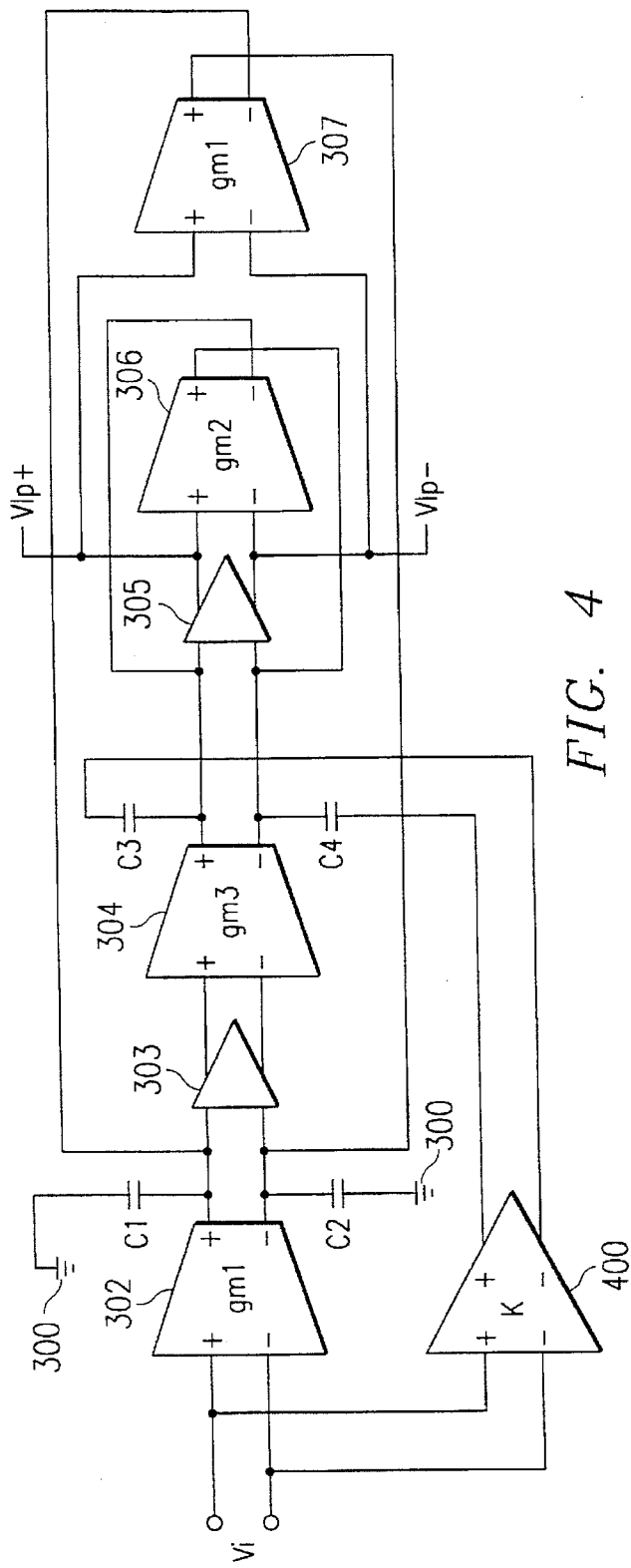
FIG. 4 is a circuit block diagram of a biquad with feed-forward pulse-slimming circuitry.

FIG. 4 illustrates a biquad with feed-forward pulse slimming or equalizing circuitry. FIG. 4 is similar to the circuit of FIG. 3 except for the addition of variable gain feedforward amplifier 400. The filter input Vi is provided to the input ports of feedforward amplifier 400. Capacitors C3 and C4 are coupled to the negative and positive output ports of feedforward amplifier 400, respectively, rather than being coupled to stable reference node 300. This arrangement serves to implement variable highpass filtering of the input signal. This has the effect of slimming the input pulses as they progress through the filter. The modified biquadratic transfer function for FIG. 4 is:

$$\frac{Vlp}{Vi} = \frac{gm1gm3 - s^2KC^2}{[s^2C^2 + sCgm2 + gm1gm3]} \quad [4]$$

with a zero located at $$\omega_z = \frac{\sqrt{gm1gm3}}{C\sqrt{K}} \quad [5]$$

The amount of high frequency boost is varied by changing the value of K and thus the location of the zeroes in the transfer function.

From equations [1]–[4], it is noted that oscillation occurs when $Q_o$ approaches infinity or gm2=0. It is also evident that the cutoff frequency $\omega_o$ is independent of the transconductance gm2. The preferred embodiment of the present invention forces gm2 to zero in order to force oscillation. As stated above, this is accomplished by altering the internal feedback of the biquad or coupling in a negative transconductance in order to cancel gm2.

Figure 6:
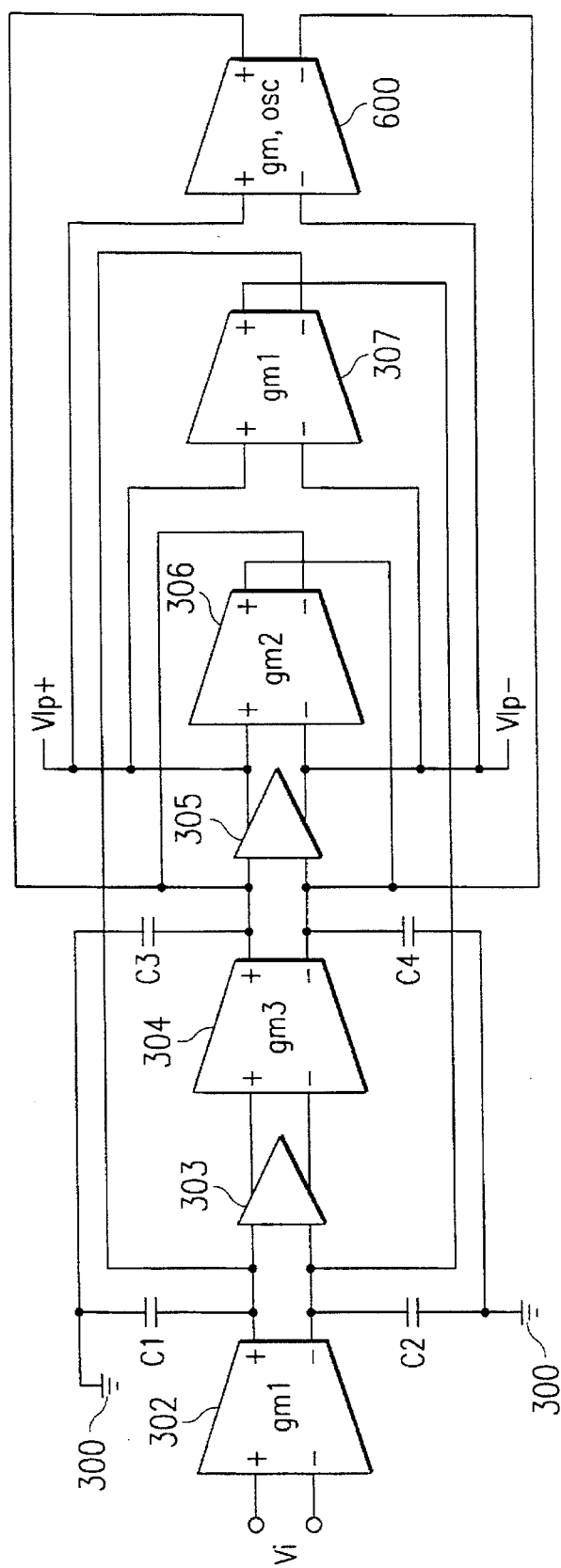
FIG. 6 is a circuit block diagram of the preferred embodiment of a biquad implementing the present invention.

FIG. 6 shows a circuit block diagram of the preferred embodiment of a biquad with oscillation mode capability. The circuit is similar to the circuit of FIG. 3 except for the addition of transconductance amplifier 600. The positive and negative input ports of transconductance amplifier 600 are coupled to the positive and negative outputs of buffer 305. The positive and negative outputs of transconductance amplifier 600 are coupled to the positive and negative inputs of buffer 305. The same placement of transconductance amplifier 600 is made in the circuit of FIG. 4 to support an oscillation test mode in a biquad/equalizer circuit.

In FIG. 6, transconductance amplifier 600 is coupled similarly to transconductance 306 of FIG. 3 except that the outputs of transconductance amplifier 600 are not crosscoupled. For this reason, the transconductance value (gm, osc) of transconductance amplifier 600 is of opposite polarity to the transconductance (gm2) of transconductance amplifier 306. When transconductance amplifier 600 is enabled for test mode, the circuit realizes:

$$\frac{Vlp}{Vi} = \frac{gm1gm3}{[s^2C^2 + sC(gm2 - gm, osc) + gm1gm3]} \quad [6]$$

with $$Q_0 = \frac{\sqrt{gm1gm3}}{(gm2 - gm, osc)} \quad [7]$$

Steady oscillation will occur when the poles in equation [6] are on the jω-axis or $Q_o$ in equation [7] is infinite. This condition is satisfied when $g_{m2}=g_{m,osc}$. With no input signal applied, a sine wave with frequency $\omega_{osc}=\omega_o$ will be present at the $V_{lp}$ output terminals. However, parasitics can pose problems in maintaining oscillation. Finite transconductance output impedances will move the poles back into the left half of the s-plane, and the oscillation will cease. To guarantee oscillation one can make $g_{m,osc}$ larger than $g_{m2}$. $Q_o$ then becomes negative and the poles move into the right half of the s-plane. However, the oscillation amplitude will be unbounded until circuit saturation occurs. This introduces nonlinear distortion and the circuit will no longer oscillate at the desired frequency $\omega_o$. An amplitude limiter must be added. This can be done with an amplitude clipping means, however, in the preferred embodiment, transconductance amplifier 600 fulfills this role.

Figure 8:
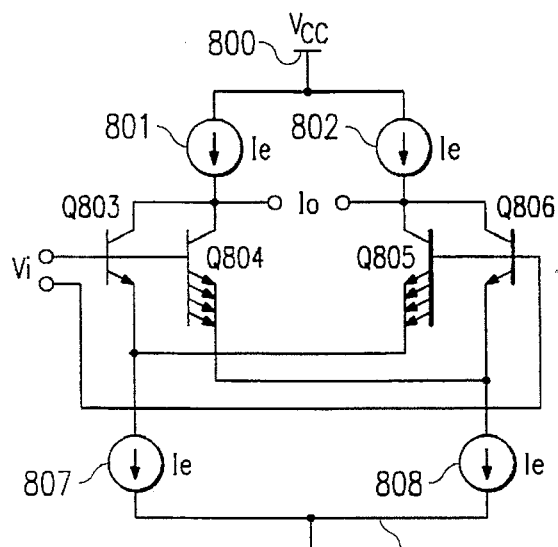
FIG. 8 is a circuit diagram of a linearized differential pair used in the preferred embodiment of a transconductance amplifier.

One possible implementation for transconductance amplifiers 302, 304, 306 and 307 is the linearized transconductance amplifier of FIG. 8. The positive voltage input is applied to the bases of transistors Q803 and Q804. The negative voltage input is applied to the bases of transistors Q805 and Q806. The collectors of transistors Q803 and Q804 are coupled to current source 801. The collectors of transistors Q805 and Q806 are coupled to current source 802. Current sources 801 and 802 are further coupled to the Vcc voltage supply 800. The emitters of transistors Q803 and Q805 are coupled to current source 807. The emitters of transistors Q804 and Q806 are coupled to current source 808. Current sources 807 and 808 are further coupled to ground node 809. Current sources 801, 802, 807 and 808 have the same current values (Ie). The current output Io is taken from between the collectors of transistors Q804 and Q805.

By increasing the size of the emitter areas in transistors Q804 and Q805 with respect to transistors Q803 and Q806, and by using cross-coupled emitter pairs for balance, increased linearity is achieved. Another suitable linearized transconductance amplifier is described in U.S. Pat. No. 5,289,136 granted to DeVeirman et al. on Feb. 22, 1994.

Figure 9:
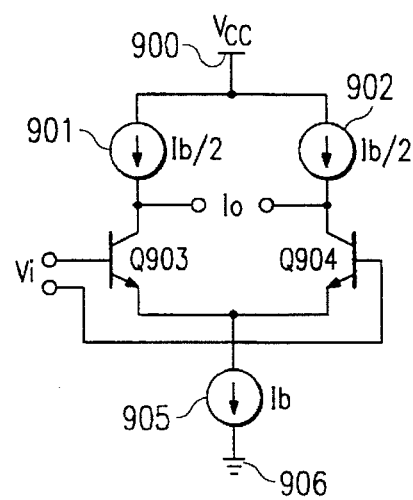
FIG. 9 is a circuit diagram of a standard differential pair used to create the negative transconductance in the preferred embodiment of the present invention.

Transconductance amplifier 600 is implemented as a simple emitter coupled pair as shown in FIG. 9. The positive voltage input is applied to the base of transistor Q903. The negative voltage input is applied to the base of transistor Q904. The emitters of transistors Q903 and Q904 are coupled together to current source 905. Current source 905 is further coupled to ground node 906. The collectors of transistors Q903 and Q904 are coupled to current sources 901 and 902, respectively. Current sources 901 and 902 are coupled to the Vcc voltage supply 900. The current output Io is taken from between the collectors of transistors Q903 and Q904. The value of the current in current sources 901 and 902 is half of the value in current source 905. The circuit of FIG. 9 can be implemented by adding only three transistors and a single resistor to the biquad. The emitter-coupled pair of transistors Q903 and Q904 require two transistors and the current source 905 can be formed from a single transistor and resistor using the current mirror circuitry already present on the chip.

In the preferred embodiment of the present invention, the absolute value of gm,osc is greater than gm2 to guarantee oscillation. This will cause the poles to move to the right half of the s-plane. However, as the amplitude grows, the transconductance gm,osc will effectively decrease in value due to the limited linear range of transconductance amplifier 600 and the poles will move back towards the left half of the s-plane. In equilibrium, the poles will be located on the jω axis. The small signal transconductance ratio gm2/gm,osc controls the oscillation amplitude. When the amplitude is limited within the linear range of transconductances gm1, gm2 and gm3, steady oscillation at frequency $\omega_o$ will occur. The biquad is then tuned to the desired frequency and the circuit is released from test mode.

Figure 11:
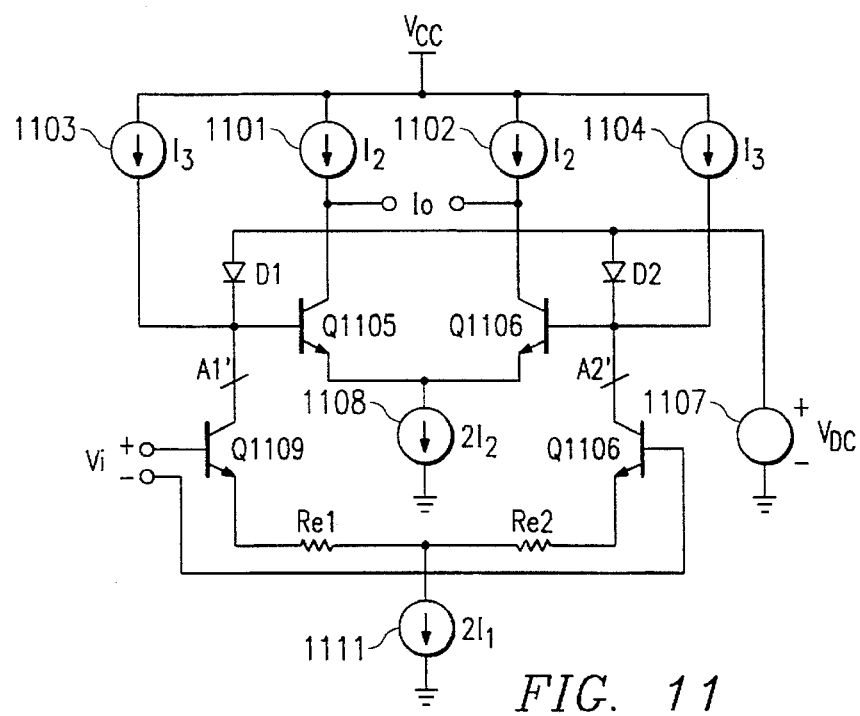
FIG. 11 is a circuit diagram of an increased linearity transconductance amplifier.
Figure 13:
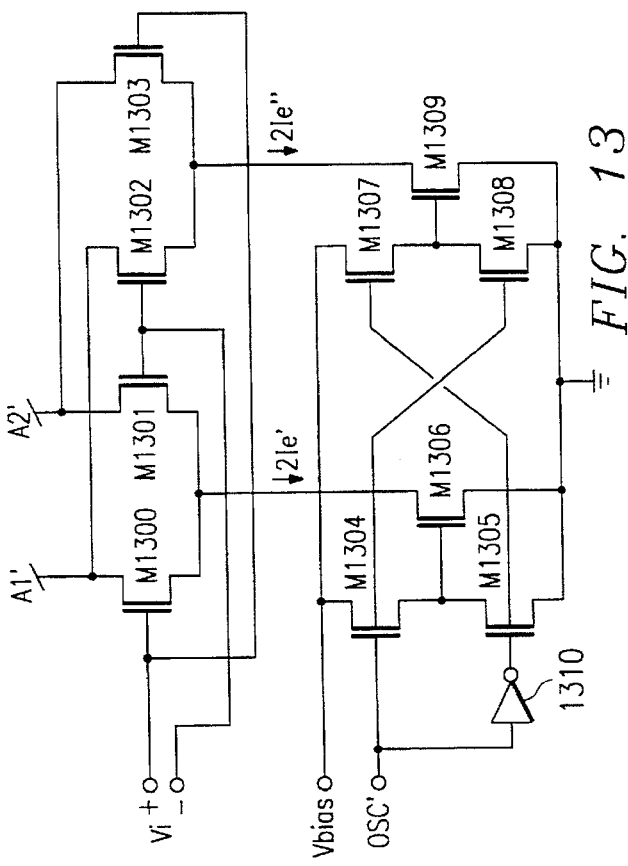
FIG. 13 is a circuit diagram of a BiCMOS embodiment for an input stage of a parallel transconductance amplifier used to induce oscillation in the present invention.
Figure 12:
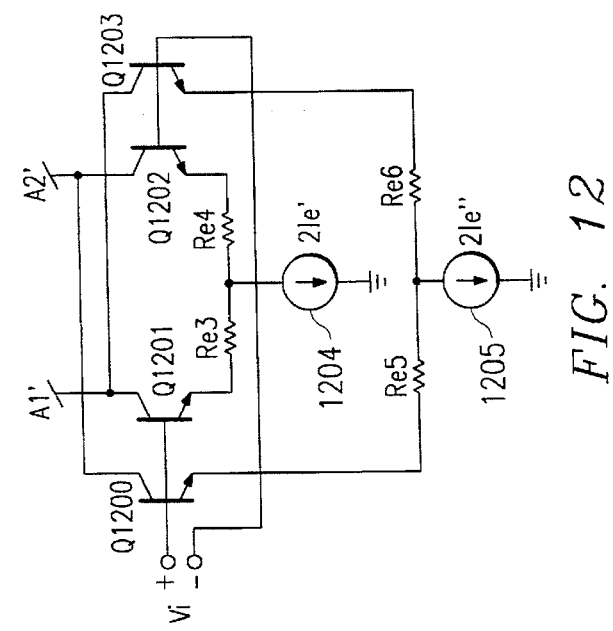
FIG. 12 is a circuit diagram of one embodiment for an input stage of a parallel transconductance amplifier used to induce oscillation in the present invention.

FIG. 11 illustrates a bipolar transconductance amplifier with increased linearity for use in another embodiment of the present invention. The input stage of the amplifier is constructed of a differential pair with emitter degeneration. The base of transistors Q1109 and Q1110 receive the positive and negative rails, respectively, of the input signal Vi. The emitters of transistors Q1109 and Q1110 are coupled to resistors Re1 and Re2, respectively. Resistors Re1 and Re2 are jointly coupled through current source 1111 to ground. The collector of transistor Q1109 is coupled to the base of transistor Q1105. The collector of transistor Q1110 is coupled to the base of transistor Q1106. The emitters of transistors Q1105 and Q1106 are jointly coupled through current source 1108 to ground. The collectors of transistors Q1105 and Q1106 are coupled to voltage supply Vcc through current sources 1101 and 1102, respectively. Current sources 1103 and 1104 are coupled between voltage supply Vcc and the bases of transistors Q1105 and Q1106, respectively. For biasing purposes, diodes D1 and D2 are coupled between DC voltage supply 1107 and the bases of transistors Q1105 and Q1106, respectively. The output current Io is taken from the collectors of transistors Q1105 and Q1106. Circuit points A1' and A2' represent the output points of the input stage. FIGS. 12 and 13 represent input stages that couple to points A1' and A2' in place of the input stage of FIG. 11.

In FIG. 11, current sources 1101 and 1102 operate with current $I_2$ in each. Current sources 1103 and 1104 operate with current $I_3$ in each. Current sources 1108 and 1111 operate with $2I_2$ and $2I_1$, respectively. The transconductance for this circuit is given by:

$$gm = \frac{I_0}{V_i} = \frac{1}{Re}\left(\frac{I_2}{I_1 - I_3}\right) \qquad [8]$$

(assuming Re1 = Re2 = Re)

The linear input range of the circuit of FIG. 11 can be made large (i.e. Vi≈2 Re $I_1$) such that the linear input range is larger than a diode drop. Thus, it is possible to use diode clamps to limit the oscillation amplitude in the biquad within the linear range of the individual transconductance amplifiers. With a clamping circuit in place, the oscillation amplitude will not expand beyond the linear range of the amplifiers. Thus, the poles of the biquad in oscillation mode can be moved into the right half-plane by merely reversing the polarity of the appropriate transconductance amplifier (i.e.

gm$_2$). This method does not require the use of a parallel reversed-polarity transconductance amplifier as described in the previous embodiment. FIGS. 12 and 13, described below, illustrate possible embodiments for polarity reversing circuits and parallel transconductance input stages. Whereas diode clamps are the preferred embodiment of the clamping circuit, other well-known clamping schemes may be used in the apparatus of the present invention.

Figure 14:
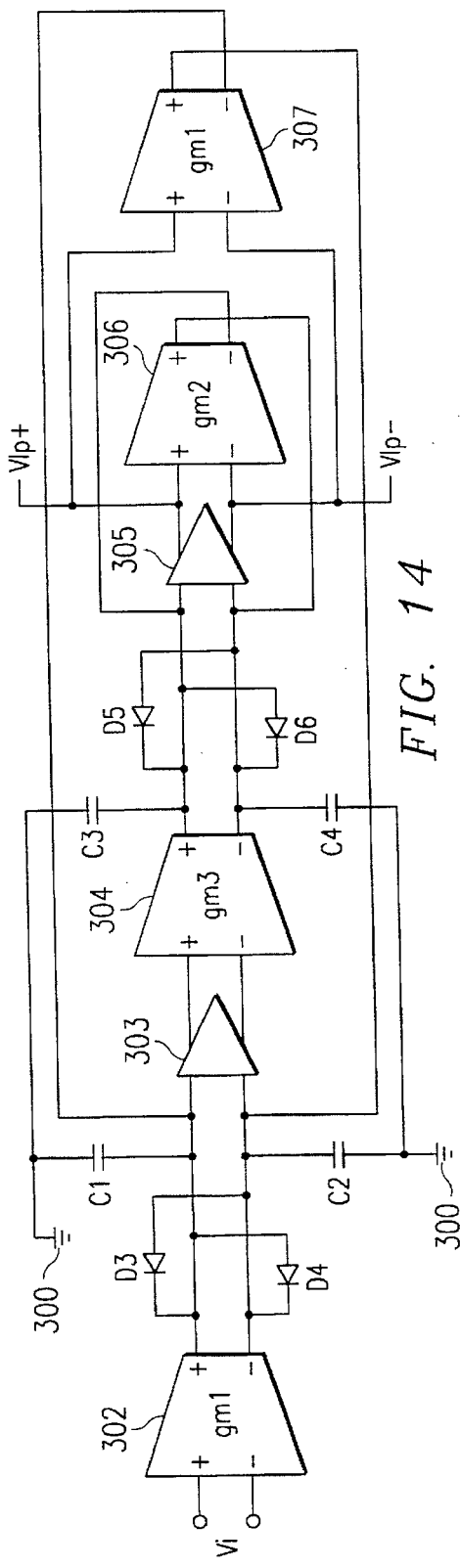
FIG. 14 is a block diagram of a biquad with clamping circuit utilized in an alternate embodiment of the present invention

FIG. 14 is a block diagram of a biquad with diode clamping means. The elements of the figure are identical to those of FIG. 3 except for the presence of diodes D3–D6. Diodes D3 and D4 are coupled across the output port of transconductance amplifier 302. Diode D3 limits the voltage across the positive and negative ports to a minimum of −Vd, where Vd is the turn-on voltage of the diode. D4 limits the voltage across the positive and negative ports to a maximum of +Vd. Diodes D5 and D6 perform the identical functions across the positive and negative ports of transconductance amplifier 304 as diodes D3 and D4, respectively. In order to make the circuit of FIG. 14 oscillate, the polarity of transconductance 306 is reversed. The transfer function of the biquad in oscillation/test mode is:

$$\frac{Vlp}{Vi} = \frac{gm1gm3}{[s^2C^2 - sCgm2 + gm1gm3]} \qquad [9]$$

The resulting waveform is an oscillating signal with frequency $\omega_o$ wherein the amplitude is clipped at ±Vd.

FIG. 12 discloses a transconductance amplifier input stage similar to the input stage of FIG. 11. However, FIG. 12 incorporates two parallel input stages of opposite polarity in a single circuit. Transistors Q1201 and Q1202, resistors Re3 and Re4, and current source 1204 correspond to transistors Q1109 and Q1110, resistors Re1 and Re2, and current source 1111 in FIG. 11. Similarly, transistors 1200 and 1203, resistors Re5 and Re6, and current source 1205 correspond in the same fashion. However, the collectors of transistors 1200 and 1203 are coupled to the opposite output nodes (i.e. A2' and A1', respectively).

To implement the polarity reversal method with the circuit of FIG. 12, in regular operation, current source 1204 is enabled and conducting current (2Ie'=2I$_1$), whereas current source 1205 is disabled. When oscillation mode is selected, current source 1204 is disabled and current source 1205 is enabled. As the frequency of oscillation for the biquad is independent of the transconductance value of this block, it is only important that current source 1205 conduct sufficient current such that the poles of the biquad are in the right half-plane. It is not necessary to have (2Ie'=2Ie").

To implement the subtracting transconductance method, in regular operation, current source 1204 is enabled to conduct current (2Ie'=2I$_1$) whereas current source 1205 is disabled. When oscillation mode is selected, current source 1204 remains enabled and current source 1205 is enabled to conduct current. The resistance of Re5 and Re6, and the current 2Ie" must be chosen such that the absolute value of the transconductance associated with transistors Q1200 and Q1203 is greater than the transconductance associated with transistors Q1201 and Q1202 (i.e. |gm,osc|>gm2).

FIG. 13 illustrates a MOSFET input stage for a transconductance amplifier including mode circuitry for enabling and disabling the current sources. The input stage of FIG. 13 can be substituted for the input stage of FIG. 11 by coupling at circuit points A1' and A2'. The resulting transconductance circuit is a BiCMOS implementation.

In FIG. 13, the positive input port of the amplifier is coupled to the gates of transistors M1300 and M1303. The negative input port of the amplifier is coupled to the gates of transistors M1301 and M1302. The drains of transistors M1300 and M1302 are coupled to circuit node A1'. The drains of transistors M1301 and M1303 are coupled to circuit node A2'. The sources of transistors M1300 and M1301 are coupled to the drain of transistor M1306. The sources of transistors M1302 and M1303 are coupled to the drain of transistor M1309. The gate of transistor M1306 is coupled to the source of transistor M1304 and to the drain of transistor M1305. The gate of transistor M1309 is coupled to the source of transistor M1307 and to the drain of transistor M1308. The drains of transistors M1304 and M1307 are coupled to bias voltage Vbias. The sources of transistors M1305, M1306, M1308 and M1309 are coupled to ground. Mode control signal OSC' is provided to inverter 1310 and the gates of transistors M1304 and M1308. The output of inverter 1310 is provided to the gates of transistors M1305 and M1307.

The transconductance for the BiCMOS configuration is:

$$gm = G_M(MOSFET) \left( \frac{I_2}{I_1 - I_3} \right) \quad [10]$$

where GM is the transconductance for the MOSFET devices around the design bias point and $I_1 = Ie'$ in normal operation.

Transistor M1306 is the current source for the standard transconductance during regular operation. Digital mode control signal OSC' is logically high, turning on transistors M1304 and M1308. Inverter 1310 generates a logical low, turning off transistors M1305 and M1307. The bias voltage Vbias provided through transistor M1304 to the gate of transistor M1306 sets the current ($2Ie' = 2I_1$). The gate of transistor M1309 is effectively grounded through M1308. Therefore, there is no current flow through transistor M1309 during regular operation.

When oscillation is desired, mode control signal OSC' is switched low, shutting off transistors M1304 and M1308. Inverter 1310 generates a logical high signal, turning on transistors M1305 and M1307. Transistor M1305 effectively shorts the gate of transistor M1306 to ground, shutting off the current for source-coupled pair M1300 and M1301, thereby disabling gm2. Transistor M1307 passes Vbias to the gate of transistor M1309 allowing transistor M1309 to act as the current source for source-coupled transistors M1302 and M1303. Thus, gm2 is replaced with a transconductance of opposite polarity. It is not necessary that Vbias provided to transistor M1309 be the same as the Vbias provided to transistor M1306, nor is it necessary for the transistors to be sized similarly. As in the bipolar implementation, only sufficient current to move the poles into the right half-plane is required.

The circuit of FIG. 13 can be modified to allow the regular polarity transconductance to operate during oscillation by providing Vbias to the gate of M1306 without the switching circuitry of transistors M1304 and M1305. In this case, the bias voltage passed to the gate of transistor M1309 and the design characteristics of transistors M1302, M1303 and M1309 must be chosen to provide a larger transconductance than that associated with transistor pair M1300 and M1301. Alternative configurations for implementing the circuit functions described in this specification will be obvious to one skilled in the art and are within the scope of the present invention.

Thus, a tuning method for integrated continuous-time filters has been described.

I claim:

1. A method for tuning a cutoff frequency of a filter having a plurality of poles in an s-plane associated with a first filter element comprising the steps of:

enabling a test mode of said filter wherein said plurality of said poles of said filter are re-positioned in a region of the right half-plane of the s-plane to achieve oscillation of said filter at said cutoff frequency, said repositioning comprising the alteration of a first value of said first filter element, said filter in said test mode having a frequency of oscillation;

tuning said filter until said frequency of oscillation has reached a desired frequency value; and disabling said test mode to stop said oscillation and to permit said filter to perform filtering operations after said tuning is complete, said disabling comprising returning said plurality of poles to the left half-plane.

2. The method of claim 1 wherein said step of enabling said test mode comprises enabling a second element in parallel with said first filter element, said second element having a second value of opposite sign relative to said first value of said first filter element.

3. The method of claim 2 wherein said second element comprises a transconductance amplifier.

4. The method of claim 2 wherein said step of enabling said test mode further comprises disabling said first filter element.

5. The method of claim 1 wherein said step of enabling said test mode comprises reversing a polarity of said first value of said first filter element.

6. The method of claim 5 further comprising the step of clamping signals within said filter.

7. The method of claim 1 wherein said step of tuning said filter comprises trimming a bias resistor.

8. The method of claim 1 wherein said step of tuning said filter comprises programming a bias current.

9. The method of claim 1 wherein said step of tuning said filter comprises programming a control voltage from a voltage source.

10. The method of claim 1 wherein said steps are performed during a one-time trim of said filter.

11. The method of claim 1 wherein said steps are performed by an on-chip tuning loop.

12. The method of claim 1 wherein said filter comprises several filter sections, and wherein a plurality of said filter sections are tuned according to said frequency of oscillation at said cutoff frequency in said test mode.

13. The method of claim 1 wherein said filter comprises several filter sections, each of said filter sections comprising a second filter element, and wherein said several filter sections are individually enabled for test mode and tuned.

14. The method of claim 1 wherein said cutoff frequency of said filter is independent of said first value.

15. A filter circuit having a built-in test mode for tuning a cutoff frequency, said filter comprising:

at least one filter section having an input and an output, said filter section filtering an input signal received on said input to provide a filtered output, said at least one filter section having a filter element with a first value;

pole shifting means coupled to said filter element, said pole shifting means enabled in said test mode, said pole shifting means altering said first value of said filter element to cause oscillation of said filter section at said cutoff frequency, by repositioning a plurality of poles of said filter section into a region of the right half-plane of the s-plane, said plurality of poles returning to the left half-plane when said pole shifting means is disabled after said tuning is complete.

16. The circuit of claim 15 wherein said at least one filter section comprises a biquad circuit.

17. The circuit of claim 16 wherein said biquad circuit comprises a plurality of transconductance means and capacitive means.

18. The circuit of claim 17 wherein said plurality of transconductance means and capacitive means comprise:

first transconductance means having a first input port and first output port, said first transconductance means having a first transconductance value;

first capacitive means coupled to said first output port;

second transconductance means having a second input port and second output port, said second input port coupled to said first capacitive means, said second transconductance means having a second transconductance value;

second capacitive means coupled to said second output port;

third transconductance means having a third input and a third output, said third input coupled to said second capacitive means, said third output coupled to said second capacitive means, said third transconductance means having a third transconductance value;

fourth transconductance means having a fourth input port and a fourth output port, said fourth input port coupled to said third input port, said fourth output port coupled to said first capacitive means, said fourth transconductance means having a fourth transconductance value.

19. The circuit of claim 18 wherein said biquad circuit further comprises gain means having an input port coupled to said first input port and an output port coupled to said second capacitive means.

20. The circuit of claim 18 wherein said pole shifting means comprise fifth transconductance means coupled in parallel with said third transconductance means, said fifth transconductance means having a fifth transconductance value of opposite polarity relative to said third transconductance value.

21. The circuit of claim 20 wherein said fifth transconductance value exceeds said third transconductance value, said fifth transconductance means having a limited linear range.

22. The circuit of claim 20 wherein said fifth transconductance value substantially cancels said third transconductance value in said test mode.

23. The circuit of claim 22 wherein said fifth transconductance value is substantially equivalent in magnitude to said third transconductance value.

24. The circuit of claim 20 wherein said third transconductance means is disabled in said test mode.

25. The circuit of claim 15 wherein said filter circuit further comprises an adjustable bias resistance.

26. The circuit of claim 15 wherein said filter circuit further comprises a programmable current source.

27. The circuit of claim 15 wherein said filter circuit further comprises a programmable voltage source.

28. The circuit of claim 15 wherein said pole shifting means comprise means for reversing a sign of a feedback gain value of a feedback loop in said at least one filter section such that oscillation occurs.

29. The method of claim 15 wherein said cutoff frequency of said filter section is independent of said first value.

30. A filter circuit having a test mode for tuning a cutoff frequency, said filter comprising:

at least one filter section having an input and an output, said at least one filter section having a plurality of poles associated with a first value of a filter element, said filter section filtering an input signal received on said input to provide a filtered output;

pole shifting means coupled to said filter element, said pole shifting means enabled in a test mode, said pole shifting means having a second value of opposing polarity to said first value of said filter element such that oscillation of said filter section occurs at said cutoff frequency for tuning said filter when said pole shifting means is enabled; and wherein said at least one filter section comprises:

first transconductance means having a first input port and first output port, said first transconductance means having a first transconductance value;

first capacitive means coupled to said first output port;

second transconductance means having a second input port and second output port, said second input port coupled to said first capacitive means, said second transconductance means having a second transconductance value;

second capacitive means coupled to said second output port;

third transconductance means having a third input and a third output, said third input coupled to said second capacitive means, said third output coupled to said second capacitive means, said third transconductance means having a third transconductance value;

fourth transconductance means having a fourth input port and a fourth output port, said fourth input port coupled to said third input port, said fourth output port coupled to said first capacitive means, said fourth transconductance means having a fourth transconductance value.

31. The circuit of claim 30 wherein said at least one filter section further comprises gain means having an input port coupled to said first input port and an output port coupled to said second capacitive means.

32. The circuit of claim 30 wherein said pole shifting means comprise fifth transconductance means coupled in parallel with said third transconductance means, said fifth transconductance means having a fifth transconductance value of opposite polarity relative to said third transconductance value.

33. The circuit of claim 32 wherein said fifth transconductance value exceeds said third transconductance value in magnitude, said fifth transconductance means having a limited linear range.

34. The circuit of claim 32 wherein said fifth transconductance value substantially cancels said third transconductance value in said test mode.

35. The circuit of claim 34 wherein said fifth transconductance value is substantially equivalent in magnitude to said third transconductance value.

36. The circuit of claim 30 wherein said filter circuit further comprises an adjustable bias resistance.

37. The circuit of claim 30 wherein said filter circuit further comprises a programmable current source.

38. The circuit of claim 30 wherein said filter circuit further comprises a programmable voltage source.

39. The circuit of claim 30 wherein said pole shifting means comprise means for reversing a sign of a feedback gain value of a feedback loop in said at least one filter section.

40. The method of claim 30 wherein said cutoff frequency of said filter section is independent of said first value.

41. A filter having an input, an output and built-in test mode for tuning a cutoff frequency of said filter comprising:

a first amplifier having a first input port coupled to said input and first output port, said first amplifier having a first gain value;

a second amplifier connected in series with said first amplifier and having a second input port and a second output port, said second amplifier having a second gain value;

a third amplifier connected in series to said second amplifier and having a third input port and a third output port wherein said third input port is coupled to said output, said third amplifier having a third gain value;

a fourth amplifier coupled to said third amplifier and having a fourth input port and a fourth output port, said fourth input port coupled to said third input port, said fourth amplifier having a fourth gain value;

a fifth amplifier coupled in parallel with said third amplifier, said fifth amplifier having a fifth gain value of opposite polarity relative to said third gain value, said fifth amplifier enabled in a test mode to cause oscillation of said filter at said cutoff frequency for tuning said filter.

42. The circuit of claim 41 wherein said filter further comprises a sixth amplifier having an input port coupled to said first input port and an output port coupled to said second output port through a capacitor.

43. The circuit of claim 41 wherein said fifth gain value exceeds said third gain value in magnitude, said fifth amplifier having a limited linear range.

44. The circuit of claim 41 wherein said fifth gain value substantially cancels said third gain value in said test mode.

45. The circuit of claim 44 wherein said fifth gain value is substantially equivalent in magnitude to said third gain value.

46. The circuit of claim 41 wherein said filter further comprises an adjustable bias resistance.

47. The circuit of claim 41 wherein said filter further comprises a programmable current source.

48. The circuit of claim 41 wherein said filter further comprises a programmable voltage source.

49. The method of claim 41 wherein said cutoff frequency of said filter is independent of said third gain value.

* * * * *